United States Patent
Katsuda et al.

(10) Patent No.: US 6,800,576 B2
(45) Date of Patent: Oct. 5, 2004

(54) ALUMINUM NITRIDE SINTERED BODIES AND MEMBERS FOR SEMICONDUCTOR-PRODUCING APPARATUSES

(75) Inventors: Yuji Katsuda, Tsushima (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 440 days.

(21) Appl. No.: 10/020,499

(22) Filed: Dec. 14, 2001

(65) Prior Publication Data

US 2002/0165079 A1 Nov. 7, 2002

(30) Foreign Application Priority Data

Dec. 21, 2000 (JP) .................................... 2000-388183

(51) Int. Cl.$^7$ ............................................ C04B 35/581
(52) U.S. Cl. ...................... 501/98.4; 279/128; 428/698
(58) Field of Search ........................ 501/98.4; 279/128; 428/698

(56) References Cited

U.S. PATENT DOCUMENTS

| | | | | |
|---|---|---|---|---|
| 5,242,872 A | | 9/1993 | Taniguchi et al. ......... | 501/98.5 |
| 5,998,321 A | * | 12/1999 | Katsuda et al. ............ | 501/98.4 |
| 6,001,760 A | * | 12/1999 | Katsuda et al. ............ | 501/98.4 |
| 6,174,583 B1 | * | 1/2001 | Yamada et al. .............. | 428/67 |
| 6,225,249 B1 | * | 5/2001 | Fujita et al. ............... | 501/98.4 |
| 6,723,274 B1 | * | 4/2004 | Divakar ..................... | 264/662 |

* cited by examiner

Primary Examiner—Karl Group
(74) Attorney, Agent, or Firm—Burr & Brown

(57) ABSTRACT

An aluminum nitride sintered body contains aluminum nitride as a main component, at least one rare earth metal element in an amount of not less than 0.4 mol % and not more than 2.0 mol % as calculated in the form of an oxide thereof and aluminum oxide component in an amount of not less than 0.5 mol % and not more than 2.0 mol %. Si content of the sintered body is not more than 80 ppm and an average particle diameter of aluminum nitride grains is not more than 3 μm. The aluminum nitride sintered body hardly peels aluminum nitride grains and exhibits high resistivity of at least $10^8$ Ω·cm even in a high temperature range of, for example, 300–500° C., as well as relatively high thermal conductivity.

53 Claims, 3 Drawing Sheets

ALUMINUM NITRIDE SINTERED BODIES AND MEMBERS FOR SEMICONDUCTOR-PRODUCING APPARATUSES

BACKGROUND OF THE INVENTION

1. Field of the Invention

The present invention relates to aluminum nitride sintered bodies and members for semiconductor-producing apparatuses using the same.

2. Description of the Related Art

Materials mainly composed of aluminum nitride are applied for electrostatic chucks, heaters for producing semiconductors and the like. When a sintering aid such as a rare earth metal oxide or an alkaline earth metal oxide is added to a raw material powder of aluminum nitride, the sintering aid reacts with oxygen impurity (alumina) on the surface of the aluminum nitride powder to form a liquid phase consisting of rare earth metal-Al—O or alkaline earth metal-Al—O, so compacting and grain growing of the powder are promoted. Concurrently, a trap effect of the oxygen impurity by rare earth metal oxide or alkaline earth metal oxide inhibits oxygen dissolution into the aluminum nitride to achieve a high thermal conductivity of the sintered body.

For instance, NGK Insulator, Ltd. disclosed in JP-A 9-315,867 that the volume resistivity of the aluminum nitride sintered body with high purity could be controlled to $10^8$ to $10^{12}$ $\Omega$·cm at room temperature by adding a very small amount of yttrium oxide thereto.

JP-B 63-046,032 discloses a process for producing an aluminum nitride sintered body having a high thermal conductivity. According to the claim, aluminum nitride powder containing 1 wt. % of oxygen is mixed with 0.01 to 15 wt. % of the oxide of metal element selected among yttrium, lanthanum, praseodymium, niobium, samarium, gadolinium and dysprosium to obtain mixed powder. The powder is then shaped and sintered to obtain an aluminum nitride sintered body having a high thermal conductivity and containing 0.01 to 20 wt. % of oxygen. In Example 1 in this patent specification, a sintered body having a thermal conductivity of 121 W/m·K at room temperature is acquired by adding 3 wt. % of a samarium oxide powder to an aluminum nitride powder containing 1 wt. % of oxygen (average particle diameter=1 $\mu$m), mixing the resultant powder and hot-pressing the mixture at 1800° C. under a pressure of 300 kg/cm$^2$ for one hour.

Since a semiconductor-producing process such as a CVD process or a sputtering process needs to form a semiconductor on a wafer, it is generally necessary to heat the wafer to a high temperature range of at least 100° C., particularly at least 200° C. In this occasion, an attracting face of an electrostatic chuck is heated by a heater buried in the electrostatic chuck or a heater so placed that it may contact with the electrostatic chuck below the electrostatic chuck.

In the electrostatic chuck, the temperature of the wafer is low at the time of placing the wafer on the attracting face of the electrostatic chuck. The temperature increases to a saturation temperature after the wafer is attracted to the chuck. In such an electrostatic chuck and a semiconductor-producing apparatus, aluminum nitride grains may be peeled and become particles due to an impact upon the wafer contacting with the electrostatic chuck immediately after the wafer is attracted, and due to a deformation of the wafer caused by a thermal expansion after the contact.

SUMMARY OF THE INVENTION

An object of the present invention is to provide aluminum nitride sintered bodies which hardly peel aluminum nitride grains and exhibit high resistivity of at least $10^8$ $\Omega$·cm even in a high temperature range of, for example, 300–500° C., as well as relatively high thermal conductivities.

Another object of the present invention is to provide members for semiconductor-producing apparatuses which hardly peel aluminum nitride grains in the semiconductor-producing apparatuses and exhibit high resistivity of at least $10^8$ $\Omega$·cm even in a high temperature range of, for example, 300–500° C., as well as relatively high thermal conductivities by using such aluminum nitride sintered bodies.

The present invention relates to aluminum nitride sintered bodies containing aluminum nitride as a main component, at least one rare earth metal element in an amount of not less than 0.4 mol % and not more than 2.0 mol % as calculated in the form of an oxide thereof and aluminum oxide component in a amount of not less than 0.5 mol % and not more than 2.0 mol %, wherein Si content is not more than 80 ppm and an average particle diameter of aluminum nitride grains is not more than 3 $\mu$m.

The present invention also relates to members for semiconductor-producing apparatuses wherein at least a part of the members comprises the aforementioned sintered bodies.

BRIEF DESCRIPTION OF THE DRAWINGS

For a better understanding of the invention, reference is made to the accompanying drawings, wherein.

DETAILED DESCRIPTION OF THE INVENTION

Figure 1:
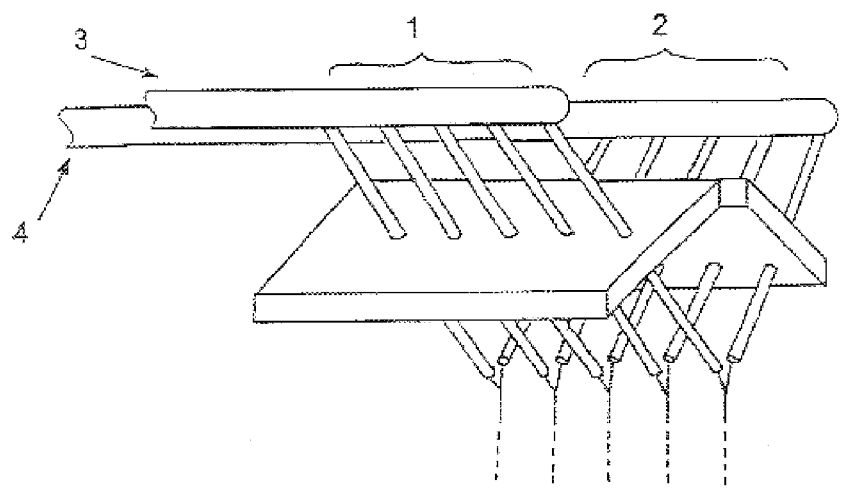
FIG. 1 is an electron micrograph of a material in Example 1.

The present inventors found that, when rare earth metal compound and alumina are added to a raw powder of the aluminum nitride and the mixture is fired, high thermal conductivity is attained and grain growth of the aluminum nitride grains is simultaneously suppressed in the sintered bodies, thereby giving sintered bodies having high hardness.

Rare earth oxides are necessary to improve the thermal conductivity. However, when only the rare earth oxides are added, although high thermal conductivity is achieved, high hardness and high strength are not acquired because the grain growth is promoted and a sufficient amount of rare-earths-Al—O grains cannot be dispersed. Therefore, a sufficient effect of improving the peeling-suppressing characteristics is not obtained when the aluminum nitride sintered bodies is contacted with the wafer On the contrary, a reason for the sintered bodies being highly hardened by simultaneously adding rare earth metal element(s) and alumina is presumed as follows: a grain-dispersing effect is obtained by localizing a grain boundary phase of rare-earths-Al—O at a vicinity of the triple point of the aluminum nitride grains. This also gives an improvement of the strength of the sintered bodies. Alumina needs to be added to enlarge a volume of the rare-earths-Al—O phase in AlN, to increase an amount of dispersing grains, and to obtain the effect of inhibiting the grain growth as well.

The hardness of the aluminum nitride sintered bodies is enhanced and metal elements having low corrosion resistivity are decreased, so that peeling of aluminum nitride grains due to a friction of the sintered bodies upon attracting/releasing the wafer can be reduced.

The amount of rare earth metal element(s) in the sintered bodies is not less than 0.3 mol % as calculated in the form of an oxide thereof, thereby acquiring high thermal conductivity. From this viewpoint, not less than 0.4 mol % is more preferable. The amount of rare earth metal element(s) in the sintered bodies is not more than 2.0 mol % as calculated in the form of an oxide thereof, thereby raising especially the hardness, etc. From this viewpoint, not more than 1.5 mol % is further preferable.

The amount of aluminum oxide component in the sintered bodies is not less than 0.5 mol %, thereby reducing the size of the aluminum nitride grains to maintain high hardness and strength of the sintered bodies. From this viewpoint, not less than 0.6 mol % of aluminum oxide component is more preferable.

The amount of aluminum oxide component in the sintered bodies is not more than 2.0 mol % as calculated in the form of an oxide thereof, thereby reducing a decrease of the thermal conductivity. From this viewpoint, not more than 1.5 mol % is further preferable.

Attainment of higher thermal conductivity together with higher hardness and strength can be made by setting the molar ratio between the earth rare metal element(s) as calculated in the form of an oxide thereof and aluminum oxide component (rare earth metal oxide/aluminum oxide component) within a range from 0.5 to 1.6. From this viewpoint, the molar ratio is more preferably not less than 0.55, and more preferably not more than 1.3.

Preferable rare earth metal elements are Y, La, Ce, Pr, Nd, Pm, Sm, Eu, Gd, Tb, Dy, Ho, Er, Tm, Yb and Lu.

Si is easily corroded especially by halogen based cleaning gases in semiconductor-producing processes. Although Si contaminated in the aluminum nitride material as an impurity exists in the form of a solid solution in the grain and/or a grain boundary precipitate, a corrosion rate of the contaminated Si is expected to be large and the Si is selectively corroded. As a result, peeling of the aluminum nitride grains existing at the vicinity of Si is promoted, or the mutual bonding of the aluminum nitride grains existing at the vicinity of Si is weakened to promote peeling of the aluminum nitride grains due to the friction when the wafer is attracted or released.

Impurity metals other than Si tend to have low corrosion resistivity as well as Si. Thus, in order to decrease the peeling, it is desirable to reduce the impurity metals. From this viewpoint, a total content of metallic impurity elements other than rare earth metal elements (aluminum is naturally excluded, but silicon atoms are included) is preferably not more than 300 ppm by weight, and more preferably not more than 50 ppm by weight.

In the present invention, surface roughness after polishing over the surface of the sintered body can be controlled to be extremely small by finely graining the aluminum nitride grains. This increases the number of contact points (attracting spots) between the wafer and the aluminum nitride in attracting/releasing the wafer, whereby stresses (loads) applied to the aluminum nitride grains upon attracting/releasing the wafer are distributed to less peeling. The aluminum nitride grain diameter also has a general correlation with roughness parameters Ra and Rt. The smaller grain diameter can finish the surface with smaller Ra and Rt.

The sintered bodies according to the present invention can provide thermal conductivity of at least 130 W/mk. In addition to the compound(s) of rare earth metal(s), alumina is incorporated to the aluminum nitride powder of the present invention, the grain growth of sintered body is further inhibited. Thus, the thermal conductivity is generally not more than 160 W/mk in many cases.

Relative density of the aluminum nitride sintered bodies is preferably not less than 95%.

In a preferred embodiment, Si content is reduced by using a high-purity raw material powder. To this end, a high-purity raw material powder is used as a raw material for any of AlN, $Y_2O_3$ and $Al_2O_3$.

Since the aluminum nitride raw material powder needs to be sintered homogeneously at a low temperature, the powder desirably has small grain diameters with a sharp grain diameter distribution. Among commercially available powders, reduced nitriding powders or gas phase-synthesized powders of alkyl aluminum are suitable. Among directly nitriding powders, powders having large grain diameters with a broad grain diameter distribution and high impurities are inappropriate.

The oxide powder of rare earth metal element and the alumina powder are desirably fine powders having high purity. As the compounds of rare earth metal elements, compound which form oxides (oxide precursors) then being heated, such as nitrates, sulfates, oxalates or alkoxides as well as oxides, may be used. The oxide precursors of the rare earth metal element may be added in the powdery form. In addition, a compound or compounds such as a nitrate, a sulfate and/or an alkoxides may be dissolved in a solvent to form a solution, and then the solution may be added to the raw material powder. When the oxide precursor is dissolved in the solvent in this way, the oxide of the rare earth metal element can be highly dispersed between the aluminum nitride grains.

Compound which form alumina (alumina precursor) when being heated, such as aluminum nitrate, aluminum sulfate, aluminum oxalate and/or aluminum alkoxide may be used as the raw material. The alumina precursor may be added in the powdery form. In addition, the compound such as aluminum nitrate, aluminum sulfate and/or aluminum alkoxide may be dissolved in a solvent to form a solution, and then the solution may be added to the raw material powder.

A known process such as a dry pressing, a doctor blade method, an extrusion or a casting method may be applied for the molding of the sintered bodies.

The sintered body of the present invention is preferably fired by hot-pressing with a pressure of not less than 50 kgf/cm$^2$. The hot-pressing firing enables attainment of compaction together with inhibition of the grain growth at a relatively low temperature and provides pore-free sintered bodies.

In the meanwhile, when yttria is added, for example, crystal phases other than the AlN phase in the sintered bodies comprise a single phase or multi phases selected among YAG ($Y_3Al_5O_{12}$), YAL (YAlO$_3$) and YAM ($Y_4Al_2O_9$). However, a clear correlation between the crystal phases and the peeling-suppressing characteristics has not been found.

The sintered bodies of the present invention can suitably be used for various members in semiconductor-producing apparatuses such as silicon wafer processing apparatuses or liquid crystal display producing apparatuses. Moreover, they are suitable for substrates in flat panel display devices.

Such members for semiconductor-producing apparatuses are preferably corrosion resistant members such as susceptors for semiconductor-producing apparatuses. In addition, the members are suitable for metal-embedded articles in which a metal member is embedded in the corrosion resistant member. As the corrosion resistant members, for example, susceptors, rings, domes or the like which are placed in the semiconductor-producing apparatuses may be recited by way of example. Resistance heating elements, electrodes of electrostatic chucks, electrodes for generating high frequencies or the like can be embedded in the susceptors.

Since the sintered bodies of the present invention have high resistivity and high purity as mentioned above, the sintered bodies are especially useful for substrates of high-temperature electrostatic chucks. Resistance heating elements, electrodes for generating plasma or the like as well as the electrodes for the electrostatic chucks may further be embedded in the substrates of the electrostatic chucks.

EXAMPLES (Mixed Powder Preparation)

Two types of high-purity reduced nitride powders (A, B) were used as powdery aluminum nitride, each of which had a purity of not less than 99.9% excluding oxygen and the average grain diameter of about 1–1.5 $\mu$m. Main impurities were Si: 10 ppm, Fe: 4 ppm, Ca: 10 ppm and C: 320 ppm in the raw material A, and Si: 35 ppm, Fe: 10 ppm, Ca: 240 ppm and C: 250 ppm in the raw material B. An yttria powder having the purity of not less than 99.9% and the average grain diameter of 0.3 $\mu$m was used. An alumina powder having the purity of not less than 99.99% and the average grain diameter of 0.5 $\mu$m was used.

These powders were measured to give compositional ratios shown in Tables 1 and 3. Then, they were subjected to wet mixing for four hours by using isopropyl alcohol as a solvent, a nylon pot and a ball. After mixing, slurry was removed and dried at 110° C. Further, the dried powder was heat-treated at 450° C. for five hours in the air atmosphere to eliminate carbon contaminated during the mixing, thereby preparing the mixed powder.

(Forming and Firing)

The above-prepared powder was uniaxially press-formed with a pressure of 20 MPa to obtain a discoid formed body having a diameter of 100 mm and a thickness of about 20 mm and the formed body was then contained in a graphite mold for firing. Thereafter, the formed body was fired with hot pressing at a pressing pressure of 20 MPa under nitrogen atmosphere pressure of 0.15 MPa and then cooled. The firing conditions (time and temperature) were shown in Tables 1 and 3. The atmosphere was evacuated to vacuum while the temperature was in a range from the room temperature to 1000° C., and nitrogen was introduced when the temperature was above 1000° C.

(Evaluation)

The following evaluations were conducted on the resultant sintered bodies. The results of the evaluation are shown in Tables 1–4.

Bulk density and open porosity: measured in water by the Archimedes method.

Contents of metal elements: determined by an inductively coupled plasma (ICP) emission spectrometry.

Oxygen content: determined by an inert gas melting infrared absorptiometry.

$Y_2O_3$ content (rare earth oxides content): converted from Y value analyzed by ICP to $Y_2O_3$ content.

$Al_2O_3$ component content: calculated from the determined oxygen content by subtracting the oxygen amount contained in $Y_2O_3$ and regarding all of the remaining oxygen as $Al_2O_3$.

AlN content: calculated by taking the above-obtained $Y_2O_3$ and $Al_2O_3$ contents from 100.

Crystal phase: identified by an X-ray diffractometer. The measuring conditions were CuK $\alpha$, 35 kV, 20 mA, $2\theta=20–70°$.

Volume resistivity: measured in a range from the room temperature to 600° C. according to the method of JIS (Japanese Industrial Standards) 2141C. A thickness of the specimen was 1 mm. Dimensions of the electrodes were such that a diameter of a main electrode was 20 mm, an inner diameter of a guard electrode was 30 mm, an outer diameter of the guard electrode was 40 mm and a voltage-applying electrode was 45 mm. A voltage of 500 V/mm was applied. The volume resistivity was calculated from a current value one minute after applying the voltage.

Bending strength: four point bending strength at room temperature according to the method of JIS R1601.

Thermal conductivity: calculated form a thermal diffusivity measured by a laser flash method at room temperature. The specific heat was 753 J/kgK.

Hardness: measured by a micro Vickers test according to JIS R1610. A surface of a specimen was mirror-finished and a load of 500 gf was applied.

Surface roughness (Ra, Rt): A surface of a discoid specimen having a diameter of 75 mm and a thickness of 1.7 mm was mirror-finished by polishing and then the surface roughness was measured. A probe having a tip diameter of 2 $\mu$mR was used, and surface roughness were measured over a length of 4.8 mm at four places, which were averaged.

Grain peeling characteristics: an electrode was formed on one side of the above-mentioned mirror-finished discoid specimen. A silicon wafer (diameter: 150 mm) and the discoid specimen (the mirror-finished side was to be contacted with the silicon wafer) were laminated on the heater in this order. The heater was then heated to stabilize the temperature of the discoid specimen at 400° C. and a voltage of 500 V was subsequently applied between the electrodes of the silicon wafer and the specimen. The silicon wafer and the specimen were attracted to each other for one minute. After cooling the specimen, a surface area of the specimen in 10–50 $mm^2$ was observed with an electron microscope. The number of peeled grains of the aluminum nitride was counted and converted to the number per area having a diameter of 75 mm (1406 $mm^2$).

Average grain diameter: the mirror-finished specimen was observed with the electron microscope. Code lengths for thirty aluminum nitride grains were averaged and multiplied by 1.5 to give the average grain diameter.

TABLE 1

| | | | | | | | | | |
|---|---|---|---|---|---|---|---|---|---|
| | | Characteristics of the sintered bodies | | | | | | | |
| Composition of the powder | Firing conditions | Bulk | Open | Volume | Bending | Thermal | Micro Vickers | Crystal | Surface roughness | Ave. grain |

| Example | AlN Type | AlN wt % | $Y_2O_3$ wt % | $Al_2O_3$ wt % | Temp °C | Time hr | dens. g/cm³ | porosity % | resistivity Ω·cm | strength MPa | cond. W/mk | hardness | phase (w/o AlN) | Ra (nm) | Rt (nm) | dia. μm |
|---|---|---|---|---|---|---|---|---|---|---|---|---|---|---|---|---|
| 1 | A | 100 | 5 | 1.5  | 1800 | 2 | 3.34 | <0.01 | 2E+16 | 441 | 139 | 1146 | YAG + YAL | 10 | 102 | 2.0 |
| 2 | A | 100 | 5 | 1.5  | 1750 | 2 | 3.34 | <0.01 | 1E+16 | 458 | 133 | 1221 | YAG + YAL | 9  | 83  | 1.9 |
| 3 | A | 100 | 5 | 0.75 | 1800 | 2 | 3.34 | <0.01 | 1E+16 | 470 | 160 | 1179 | YAG + YAL | 9  | 98  | 2.5 |
| 4 | B | 100 | 3 | 0.2  | 1800 | 2 | 3.31 | <0.01 | 8E+15 | 446 | 153 | 1120 | YAL       | 11 | 129 | 2.6 |
| 5 | B | 100 | 3 | 1    | 1750 | 2 | 3.30 | <0.01 | 7E+15 | 501 | 141 | 1130 | YAG       | 10 | 84  | 2.1 |
| 6 | B | 100 | 5 | 0.75 | 1800 | 2 | 3.34 | <0.01 | 1E+16 | 477 | 158 | 1100 | YAL + YAM | 13 | 121 | 2.9 |
| 7 | B | 100 | 5 | 1.5  | 1800 | 2 | 3.34 | <0.01 | 7E+15 | 489 | 148 | 1110 | YAG + YAL | 12 | 126 | 2.8 |
| 8 | B | 100 | 5 | 1.5  | 1750 | 2 | 3.34 | <0.01 | 7E+15 | 441 | 140 | 1110 | YAG + YAL | 10 | 93  | 2.5 |

TABLE 2

| Example | Si ppm | Fe ppm | Ca ppm | Y wt % | O wt % | C wt % | $Y_2O_3$ mol % | $Al_2O_3$ mol % | AlN mol % | $Y_2O_3/Al_2O_3$ molar ratio | Peeled grains/ φ75 mm |
|---|---|---|---|---|---|---|---|---|---|---|---|
| 1 | 3  | 4 | 5   | 3.67 | 2.18 | 0.03 | 0.89 | 1.07 | 98.03 | 0.83 | 0  |
| 2 | 3  | 4 | 5   | 3.63 | 2.19 | 0.03 | 0.88 | 1.09 | 98.02 | 0.81 | 0  |
| 3 | 3  | 5 | 4   | 3.69 | 1.88 | 0.04 | 0.89 | 0.79 | 98.31 | 1.13 | 28 |
| 4 | 25 | 7 | 220 | 2.26 | 1.31 | 0.03 | 0.54 | 0.62 | 98.84 | 0.87 | 28 |
| 5 | 28 | 7 | 220 | 2.25 | 1.63 | 0.03 | 0.54 | 0.91 | 98.56 | 0.59 | 0  |
| 6 | 27 | 6 | 210 | 3.65 | 1.87 | 0.04 | 0.88 | 0.79 | 98.32 | 1.11 | 28 |
| 7 | 26 | 6 | 210 | 3.63 | 2.17 | 0.03 | 0.88 | 1.07 | 98.04 | 0.82 | 28 |
| 8 | 27 | 7 | 220 | 3.58 | 2.17 | 0.03 | 0.87 | 1.08 | 98.04 | 0.80 | 0  |

TABLE 3

| Comparative Example | AlN Type | AlN wt % | $Y_2O_3$ wt % | $Al_2O_3$ wt % | Temp °C | Time hr | dens. g/cm³ | porosity % | resistivity Ω·cm | strength MPa | cond. W/mk | hardness | phase (w/o AlN) | Ra (nm) | Rt (nm) | dia. μm |
|---|---|---|---|---|---|---|---|---|---|---|---|---|---|---|---|---|
| 1 | B | 100 | 2 | 0   | 1800 | 2 | 3.29 | <0.01 | 8E+15 | 384 | 152 | 1070 | YAG + YAL | 21 | 178 | 3.4 |
| 2 | B | 100 | 5 | 0   | 1800 | 2 | 3.32 | <0.01 | 4E+15 | 338 | 175 | 1070 | YAM       | 20 | 174 | 3.2 |
| 3 | B | 100 | 5 | 0   | 1900 | 2 | 3.30 | <0.01 | 1E+14 | 325 | 187 | 1020 | YAM       | 26 | 240 | 5.5 |
| 4 | A | 100 | 5 | 1.5 | 1900 | 2 | 3.34 | <0.01 | 4E+14 | 434 | 153 | 1040 | YAG + YAL | 18 | 188 | 4.2 |
| 5 | B | 100 | 3 | 1   | 1900 | 2 | 3.30 | <0.01 | 4E+14 | 438 | 145 | 1060 | YAG + YAL | 21 | 197 | 4.4 |
| 6 | B | 100 | 5 | 1.5 | 1900 | 2 | 3.29 | <0.01 | 3E+14 | 429 | 168 | 1060 | YAG + YAL | 23 | 209 | 4.7 |

TABLE 4

| Comparative Example | Si ppm | Fe ppm | Ca ppm | Y wt % | O wt % | C wt % | $Y_2O_3$ mol % | $Al_2O_3$ mol % | AlN mol % | $Y_2O_3/Al_2O_3$ molar ratio | Peeled grains/ φ75 mm |
|---|---|---|---|---|---|---|---|---|---|---|---|
| 1 | 23 | 7 | 220 | 1.51 | 1.04 | 0.03 | 0.36 | 0.55 | 99.09 | 0.64 | 253 |
| 2 | 22 | 9 | 180 | 3.67 | 1.54 | 0.04 | 0.89 | 0.49 | 98.62 | 1.80 | 281 |
| 3 | 20 | 8 | 88  | 1.58 | 0.90 | 0.03 | 0.37 | 0.41 | 99.21 | 0.90 | 844 |
| 4 | 11 | 4 | 5   | 3.54 | 2.20 | 0.04 | 0.86 | 1.12 | 98.02 | 0.77 | 478 |
| 5 | 30 | 7 | 180 | 2.11 | 1.54 | 0.04 | 0.50 | 0.86 | 98.64 | 0.59 | 591 |
| 6 | 22 | 8 | 67  | 1.14 | 0.81 | 0.03 | 0.27 | 0.44 | 99.30 | 0.61 | 703 |

FIG. 1 shows a backscattering electron microscopic photograph of the material in Example 1. In this figure, white grains isolated at triple points of the aluminum nitride grains were the Y—Al—O phase.

As shown in Example 1–8 and FIG. 1, the given amounts of yttria and aluminum oxide component are incorporated in the aluminum nitride sintered bodies and the grain diameters are controlled to be not more than 3 μm, so that the aluminum nitride sintered bodies with less peeling can be obtained.

The contents of metallic impurities of the sintered bodies (excluding rare earth metals) are from several tens ppm to about 300 ppm, which are very low, and the Si content is especially low as 30 ppm or less. Therefore, a high corrosion resistance under an atmosphere of a semiconductor-producing process can be obtained.

A sintered body with a good peeling-suppressing characteristic has a high surface hardness (not less than 1100), a large bending strength (not less than 400 MPa) and a small surface roughness (Ra, Rt). In an example using the material A with much less impurities, the grain growth is especially inhibited and thus a good peeling-suppressing characteristic is obtained. The thermal conductivity is 130–160 W/mK, which means highly thermal conductive.

Figure 2:
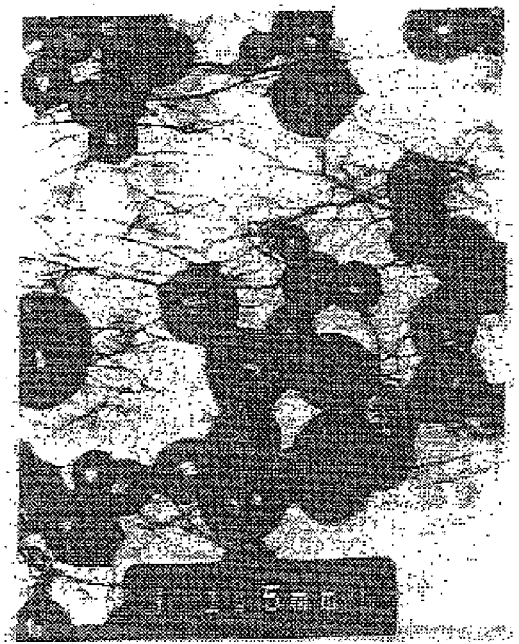
FIG. 2 is a graph representing a relationship between a volume resistivity $\rho$ and a temperature T of each of sintered bodies in Examples 1–4.
Figure 2:
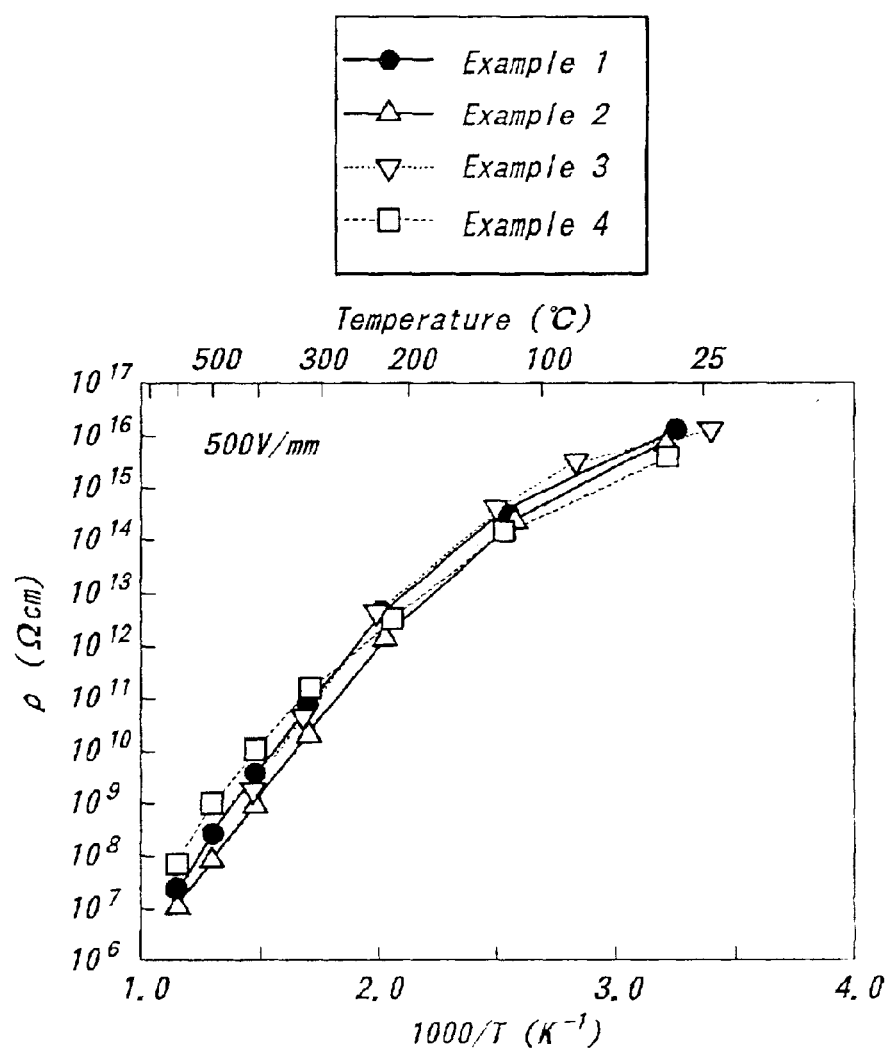
Figure 3:
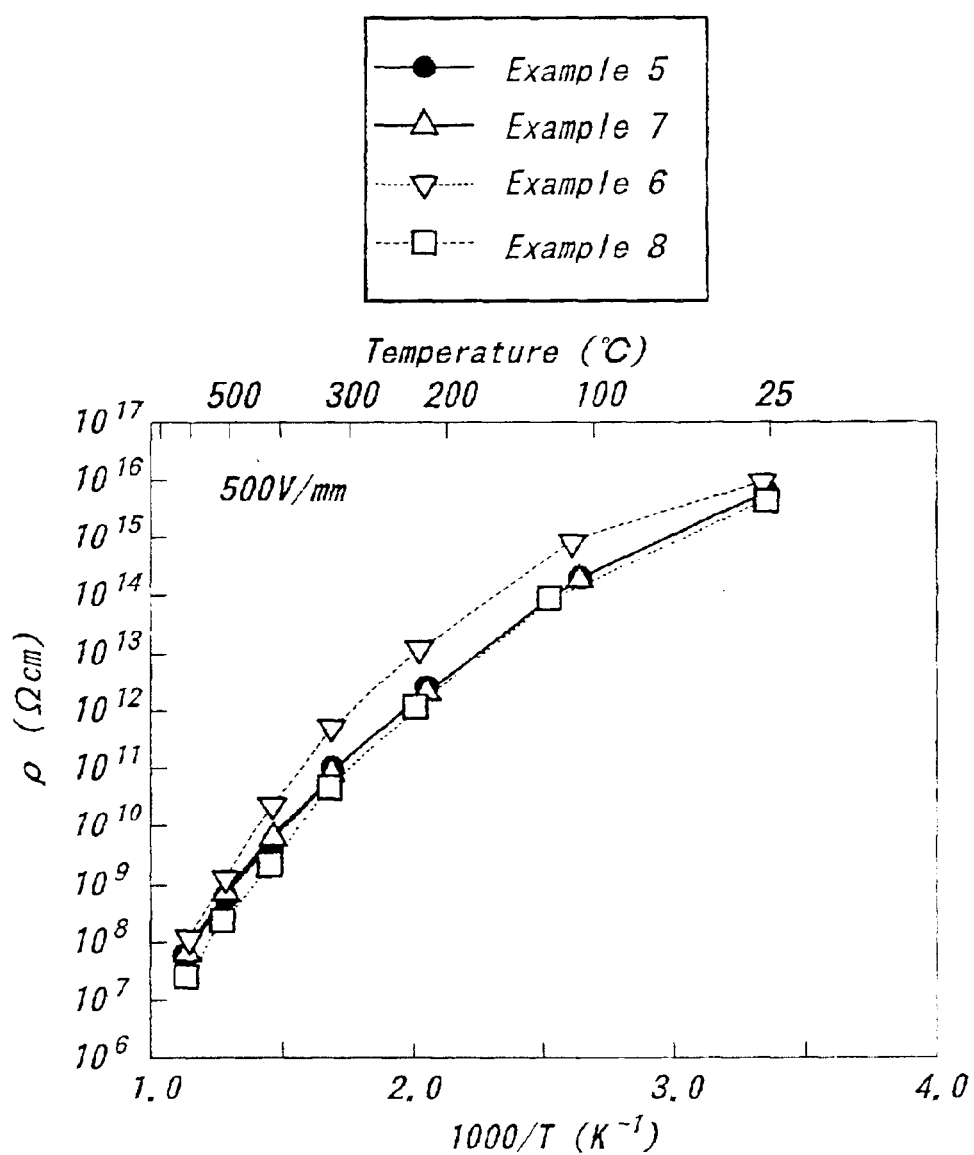
FIG. 3 is a graph representing a relationship between a volume resistivity $\rho$ and a temperature T of each of sintered bodies in Examples 5–8.

Electrical characteristics of these sintered bodies at a high temperature are shown in FIGS. 2 and 3. Each Example has a high resistance of not less than $1\times10^8$ Ω·cm (1e8 Ω·cm) at 500° C. When a resistance range adaptable for the electrostatic chuck is from 1e8 to 1e12 Ω·cm, each material satisfies this optimum resistance range in a temperature range of 300–500° C. and has a sufficient attracting/releasing property for the electrostatic chuck in this temperature range. Moreover, a sintered body with the larger thermal conductivity and the smaller grain diameter tends to have the higher volume resistivity. The reason for this is inferred that a sintered body with a larger thermal conductivity has fewer defects in aluminum nitride grains, which gives fewer electrons acting as conductive carriers. It is inferred that a sintered body with the smaller grain diameter has the larger grain boundary resistance.

In Comparative Examples 1–6, the amount of peeled grains was high because the amounts of yttria and aluminum oxide component were less than the given amounts in the sintered bodies, or because the grain diameters were greater than 3 μm, etc. Further, the hardness and the strength tended to be small. Ra and Rt of the surface increased as the grains grow.

As having been described in the above, the aluminum nitride sintered bodies according to the present invention hardly peel aluminum nitride grains and exhibit high resistivity of at least $10^8$ Ω·cm in a high temperature range, for example 300–500° C., as well as relatively high thermal conductivities.

While the preferred embodiments of the present invention have been described, it is to be understood that modifications and variations may be made without departing from the sprit of the invention. The cope of the invention, therefore, is to be determined only by the following claims.

What is claimed is:

1. An aluminum nitride sintered body comprising aluminum nitride as a main component, at least one rare earth metal element in an amount of not less than 0.4 mol % and not more than 2.0 mol % as calculated in the form of an oxide thereof and aluminum oxide component in a amount of not less than 0.5 mol % and not more than 2.0 mol %, wherein Si content is not more than 80 ppm and an average grain diameter of aluminum nitride grains is not more than 3 μm.

2. The aluminum nitride sintered body as claimed in claim 1, wherein a molar ratio between said at least one rare earth metal element as calculated in the form of an oxide thereof and aluminum oxide component (rare earth metal oxide/aluminum oxide component) is within a range of not less than 0.5 and not more than 1.6.

3. The aluminum nitride sintered body as claimed in claim 2, which has micro Vickers hardness of not less than 1100.

4. The aluminum nitride sintered body as claimed in claim 2, which has four point bending strength of not less than 400 MPa.

5. The aluminum nitride sintered body as claimed in claim 3, which has four point bending strength of not less than 400 MPa.

6. The aluminum nitride sintered body as claimed in claim 2, which has thermal conductivity of not less than 130 W/mK.

7. The aluminum nitride sintered body as claimed in claim 3, which has thermal conductivity of not less than 130 W/mK.

8. The aluminum nitride sintered body as claimed in claim 2, which has volume resistivity of not less than $1\times10^{14}$ Ω·cm at room temperature.

9. The aluminum nitride sintered body as claimed in claim 3, which has volume resistivity of not less than $1\times10^{14}$ Ω·cm at room temperature.

10. The aluminum nitride sintered body as claimed in claim 2, which has four point bending strength of not less than 400 MPa and volume resistivity of not less than $1\times10^{14}$ Ω·cm at room temperature.

11. The aluminum nitride sintered body as claimed in claim 3, which has four point bending strength of not less than 400 MPa and volume resistivity of not less than $1\times10^{14}$ Ω·cm at room temperature.

12. The aluminum nitride sintered body as claimed in claim 2, which has a total content of metallic impurity elements other than said at least one rare earth metal element of not more than 300 ppm by weight.

13. The aluminum nitride sintered body as claimed in claim 3, which has a total content of metallic impurity elements other than said at least one rare earth metal element of not more than 300 ppm by weight.

14. The aluminum nitride sintered body as claimed in claim 2, which has volume resistivity of not less than $1\times10^{14}$ Ω·cm at room temperature and a total content of metallic impurity elements other than said at least one rare earth metal element of not more than 300 ppm by weight.

15. The aluminum nitride sintered body as claimed in claim 3, which has volume resistivity of not less than $1\times10^{14}$ Ω·cm at room temperature and a total content of metallic impurity elements other than said at least one rare earth metal element of not more than 300 ppm by weight.

16. The aluminum nitride sintered body as claimed in claim 2, wherein a total content of metallic impurity elements other than rare earth metal elements in the sintered body is not more than 50 ppm by weight.

17. The aluminum nitride sintered body as claimed in claim 3, wherein a total content of metallic impurity elements other than rare earth metal elements in the sintered body is not more than 50 ppm by weight.

18. The aluminum nitride sintered body as claimed in claim 2, which has volume resistivity of not less than $1\times10^{14}$ Ω·cm at room temperature, wherein a total content of metallic impurity elements other than rare earth metal elements in the sintered body is not more than 50 ppm by weight.

19. The aluminum nitride sintered body as claimed in claim 3, which has volume resistivity of not less than $1\times10^{14}$ Ω·cm at room temperature, wherein a total content of metallic impurity elements other than rare earth metal elements in the sintered body is not more than 50 ppm by weight.

20. A member for a semiconductor-producing apparatus, wherein at least a part of the member consists of the sintered body as claimed in claim 2.

21. A member for a semiconductor-producing apparatus, wherein at least a part of the member consists of the sintered body as claimed in claim 3.

22. The member as claimed in claim 20, comprising a substrate comprising of said sintered body and a metallic member buried therein.

23. The member as claimed in claim 21, comprising a substrate comprising of said sintered body and a metallic member buried therein.

24. The member as claimed in claim 22, wherein said metallic member at least comprises an electrode for a heater.

25. The member as claimed in claim 23, wherein said metallic member at least comprises an electrode for a heater.

26. The member as claimed in claim 22, wherein said metallic member at least comprises an electrode for an electrostatic chuck.

27. The member as claimed in claim 23, wherein said metallic member at least comprises an electrode for an electrostatic chuck.

28. The member as claimed in claim 24, wherein said metallic member at least comprises an electrode for an electrostatic chuck.

29. The member as claimed in claim 25, wherein said metallic member at least comprises an electrode for an electrostatic chuck.

30. The aluminum nitride sintered body as claimed in claim 2, which has four point bending strength of not less than 400 MPa, thermal conductivity of not less than 130 W/mK, volume resistivity of not less than $1 \times 10^{14}$ Ω·cm at room temperature and a total content of metallic impurity elements other than said at least one rare earth metal element of not more than 300 ppm by weight.

31. The aluminum nitride sintered body as claimed in claim 3, which has four point bending strength of not less than 400 MPa, thermal conductivity of not less than 130 W/mK, volume resistivity of not less than $1 \times 10^{14}$ Ω·cm at room temperature and a total content of metallic impurity elements other than said at least one rare earth metal element of not more than 300 ppm by weight.

32. A member for a semiconductor-producing apparatus, wherein at least a part of the member consists of the sintered body as claimed in claim 30.

33. A member for a semiconductor-producing apparatus, wherein at least a part of the member consists of the sintered body as claimed in claim 31.

34. The aluminum nitride sintered body as claimed in claim 2, which has four point bending strength of not less than 400 MPa, thermal conductivity of not less than 130 W/mK and volume resistivity of not less than $1 \times 10^{14}$ Ω·cm at room temperature, wherein a total content of metallic impurity elements other than rare earth metal elements in the sintered body is not more than 50 ppm by weight.

35. The aluminum nitride sintered body as claimed in claim 3, which has four point bending strength of not less than 400 MPa, thermal conductivity of not less than 130 W/mK and volume resistivity of not less than $1 \times 10^{14}$ Ω·cm at room temperature, wherein a total content of metallic impurity elements other than rare earth metal elements in the sintered body is not more than 50 ppm by weight.

36. A member for a semiconductor-producing apparatus, wherein at least a part of the member consists of the sintered body as claimed in claim 34.

37. A member for a semiconductor-producing apparatus, wherein at least a part of the member consists of the sintered body as claimed in claim 35.

38. The member as claimed in claim 32, comprising a substrate comprising of said sintered body and a metallic member buried therein.

39. The member as claimed in claim 33, comprising a substrate comprising of said sintered body and a metallic member buried therein.

40. The member as claimed in claim 36, comprising a substrate comprising of said sintered body and a metallic member buried therein.

41. The member as claimed in claim 37, comprising a substrate comprising of said sintered body and a metallic member buried therein.

42. The member as claimed in claim 38, wherein said metallic member at least comprises an electrode for a heater.

43. The member as claimed in claim 39, wherein said metallic member at least comprises an electrode for a heater.

44. The member as claimed in claim 40, wherein said metallic member at least comprises an electrode for a heater.

45. The member as claimed in claim 41, wherein said metallic member at least comprises an electrode for a heater.

46. The member as claimed in claim 38, wherein said metallic member at least comprises an electrode for an electrostatic chuck.

47. The member as claimed in claim 39, wherein said metallic member at least comprises an electrode for an electrostatic chuck.

48. The member as claimed in claim 42, wherein said metallic member at least comprises an electrode for an electrostatic chuck.

49. The member as claimed in claim 43, wherein said metallic member at least comprises an electrode for an electrostatic chuck.

50. The member as claimed in claim 40, wherein said metallic member at least comprises an electrode for an electrostatic chuck.

51. The member as claimed in claim 41, wherein said metallic member at least comprises an electrode for an electrostatic chuck.

52. The member as claimed in claim 44, wherein said metallic member at least comprises an electrode for an electrostatic chuck.

53. The member as claimed in claim 45, wherein said metallic member at least comprises an electrode for an electrostatic chuck.

* * * * *